(12) United States Patent
Chao et al.

(10) Patent No.: US 6,849,523 B2
(45) Date of Patent: Feb. 1, 2005

(54) PROCESS FOR SEPARATING DIES ON A WAFER

(75) Inventors: Te-Tsung Chao, Kaohsiung (TW); Shu-Shen Chiu, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 53 days.

(21) Appl. No.: 10/387,285

(22) Filed: Mar. 12, 2003

(65) Prior Publication Data

US 2004/0180514 A1 Sep. 16, 2004

(51) Int. Cl.[7] .......................... H01L 21/46; H01L 21/78
(52) U.S. Cl. ...................... 438/460; 438/462; 438/464; 438/465
(58) Field of Search .................. 438/460, 462, 438/464, 465

(56) References Cited

U.S. PATENT DOCUMENTS 3,040,489 A * 6/1962 Da Costa ..................... 53/435

* cited by examiner

Primary Examiner—Alexander Ghyka
(74) Attorney, Agent, or Firm—Tung & Associates'

(57) ABSTRACT

A process for separating IC dies from a wafer substrate. In one embodiment, complete separation channels are initially cut through the wafer between dies along one axis. Next, partial separation channels are cut into the wafer along an intersecting axis, leaving wafer material connecting adjacent dies. In another embodiment, partial separation channels are cut into the wafer along one axis, after which complete separation channels are cut through the wafer along the intersecting axis. In still another embodiment, partial separation channels are cut along both axes.

8 Claims, 3 Drawing Sheets

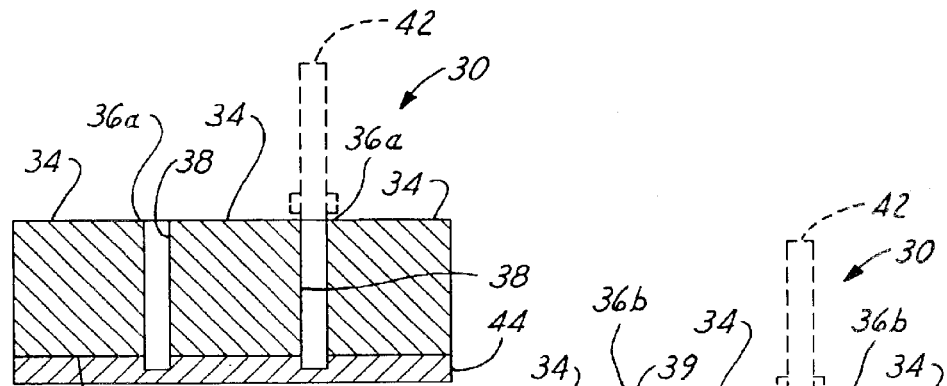
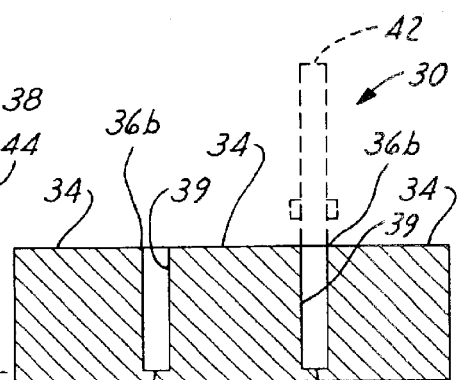
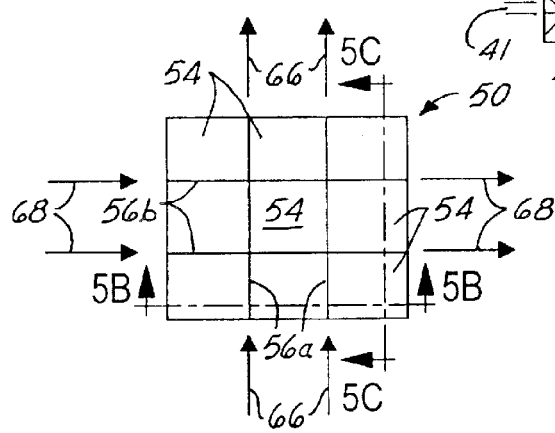
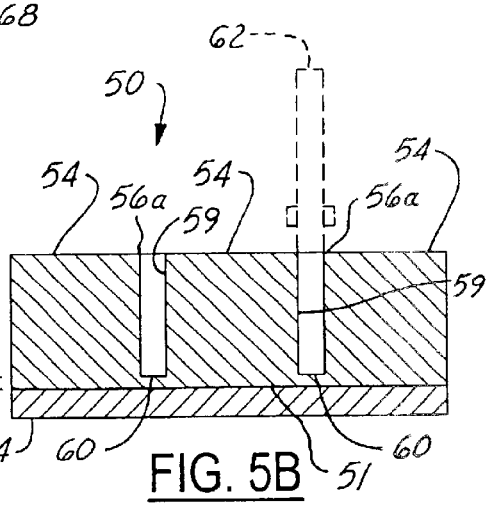
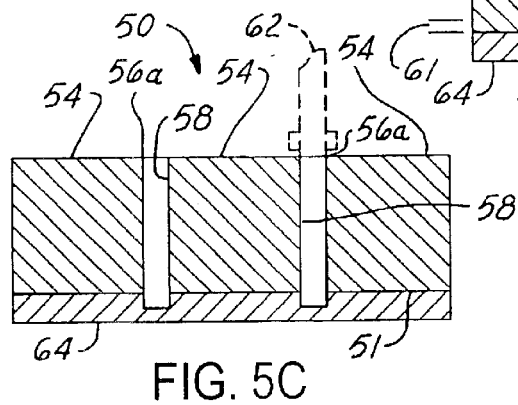
FIG. 4B
FIG. 4C
FIG. 5A
FIG. 5B
FIG. 5C

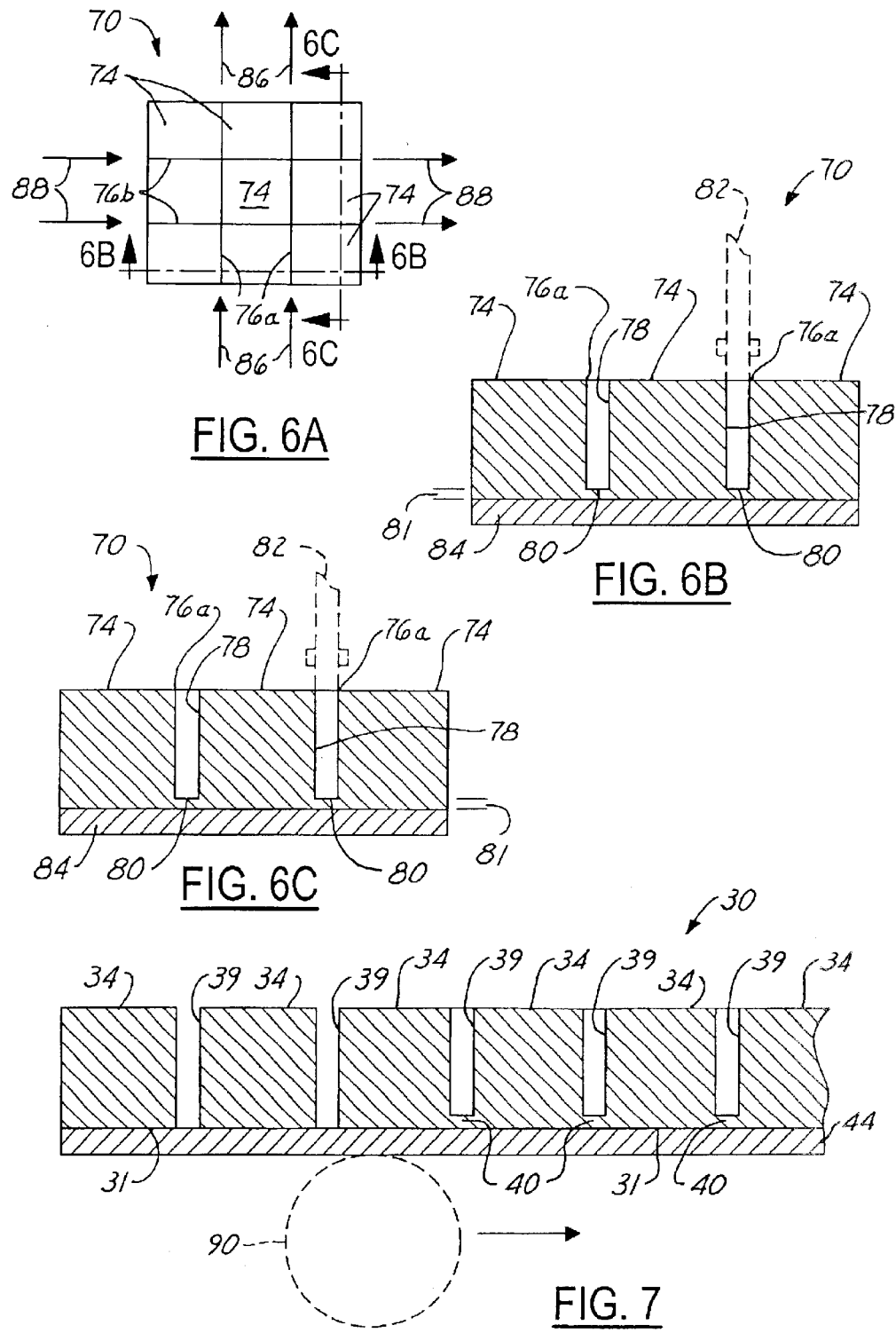

PROCESS FOR SEPARATING DIES ON A WAFER

FIELD OF THE INVENTION

The present invention relates to the fabrication of integrated circuit die on a semiconductor wafer substrate. More particularly, the present invention relates to a process for separating die on a wafer in such a manner that chipping and cracking of the die is prevented or at least minimized.

BACKGROUND OF THE INVENTION

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. Chemical vapor deposition (CVD) processes are widely used to form layers of materials on a semiconductor wafer. Other processing steps in the fabrication of the circuits include formation of a photoresist or other mask such as titanium oxide or silicon oxide, in the form of the desired metal interconnection pattern, using standard lithographic techniques; subjecting the wafer substrate to a dry etching process to remove the conducting layer from the areas not covered by the mask, thereby leaving the metal layer in the form of the masked pattern; removing the mask layer using reactive plasma and chlorine gas, thereby exposing the top surface of the metal interconnect layer; cooling and drying the wafer substrate by applying water and nitrogen gas to the wafer substrate; and removing or stripping polymer residues from the wafer substrate.

After the devices are fabricated on the wafer surface, the wafers may be transported to a separate facility which is remote from the fabrication facility for packaging or other processing. The integrated circuits on the wafer are prone to damage due to mechanical shock during transit from the fabrication facility to the packaging or other facility. In addition to mechanical shock, integrated circuits are susceptible to damage by electrostatic discharges (ESD) and electrical overstress (EOS). As USLI technology continues downscaling of device features, the wafer size becomes correspondingly larger for economical production of the integrated circuits. Accordingly, the wafers become increasingly expensive with increased size. For example, the cost of a 12" wafer is about 2.5 times the cost of an 8" wafer. One production lot (25 wafers) of 8" wafers costs about $40,000. Thus, protection of the wafers during shipping is of utmost importance.

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Before they are used as electronic components in electronic appliances such as cell phones, computer processors and the like, the IC chips or die are separated from each other in the wafer and removed from the wafer for higher-order packaging. This die separation step is typically accomplished using a diamond-bladed saw, which cuts the wafer material between dies along multiple parallel X-axis scribe lines and multiple parallel Y-axis scribe lines in the wafer surface. Accordingly, the intact or uncut wafers having the die fabricated thereon are first removed from a wafer cassette and placed on an adhesive tape that is secured to a rigid support frame. The adhesive tape serves to secure the die to the support frame once the silicon wafer material is severed along the scribe lines between adjacent die. A diamond-blade dicing saw is used to cut the wafer along the X-axis and Y-axis scribe lines, to separate the adjacent die from each other. As the die are diced from the wafer, a DI water spray is used to remove silicon slurry residue generated by the saw. After the dicing process, the adhesive tape may be cured by UV radiation to attenuate the adhesive strength of the tape. Finally, the multiple die, severed from each other and from the wafer, are lifted from the adhesive tape.

As shown in FIG. 1, in the conventional die-separating process, the diamond-studded saw blade 18 cuts a separation channel 14 completely through the silicon wafer material of a wafer 10, between each die 20 and along the scribe lines 12 inscribed on the surface of the wafer 10. Each separation channel 14 cut by the saw blade 18 extends typically about halfway through the thickness of the adhesive tape 16, leaving the lower half thickness of the tape 16 to secure the separated die 20 together on the support frame. Accordingly, particularly for small die (~10 mm or less thickness) which are characteristic of advanced IC fabrication processes, there remains no silicon wafer material and an inadequate thickness of adhesive tape between adjacent die to absorb much of the vibration imparted by the saw blade as the blade cuts along the remaining scribe lines separating each die from the adjacent die. Consequently, as shown in FIG. 2, the saw-induced vibration which accompanies the conventional method of cutting the entire thickness of the wafer material and half of the thickness of the adhesive tape beneath the scribe lines between the die frequently forms chips 22 in the top and backside edges of the die, as well as cracks 24 in the die 24, during the dicing process. The chips and cracks are typically most abundant along the side of the die which is the last to be severed from the wafer.

Several approaches have been taken to ameliorate the vibration-induced chipping and cracking of IC dies during the die separation process. One of these includes the use of a high-strength adhesion tape to bind the wafer to the support frame and to absorb vibrational energy during dicing, followed by UV curing of the tape prior to lifting the separated die from the tape. However, this process contributes excessive overall cost to the die separation process. Another approach includes the use of high-strength adhesive tape to bind the wafer, followed by the use of a saw blade designed for cutting thin wafers in order to reduce vibration during dicing. While reducing the formation of vibration-induced cracks and chips in the die during the die separation step, this process leads to cracking and chipping of the die as the separated die are subsequently lifted from the tape. Accordingly, a new and improved process is needed for separating die on a wafer in order to prevent cracking and/or chipping of the die due to excessive vibrational energy imparted by a wafer-dicing saw.

Accordingly, an object of the present invention is to provide a new and improved method for separating die from each other in a wafer substrate.

Another object of the present invention is to provide a die-separating process which prevents or at least minimizes cracking and/or chipping of die as the die are separated from each other in a wafer.

Still another object of the present invention is to provide a die-separating process which facilitates the absorption of vibrational energy imparted by a dicing saw in order to prevent or at least minimize cracking and/or chipping of the dies during the die separation process.

Yet another object of the present invention is to provide a die-separating process in which a single channel or all channels separating a die from other adjacent dies in a wafer are partially, rather than completely, cut through the wafer material in order to facilitate the absorption of vibrational dicing energy by the uncut wafer material during the die separation process and thereby prevent cracking and/or chipping of the die.

A still further object of the present invention is to provide a die-separating process which includes initially cutting partial separation channels through the wafer material along the X-axis scribe lines and then complete separation channels through the wafer material along the Y-axis scribe lines separating a die from adjacent dies in a wafer; cutting complete separation channels along the X-axis scribe lines and then partial separation channels along the Y-axis scribe lines; or cutting partial separation channels along the X-axis scribe lines followed by partial separation channels along the Y-axis scribe lines, in order to maintain sufficient thickness of wafer material between the adjacent dies to facilitate the absorption of saw blade-induced vibrational energy by the uncut wafer material during the die separation process.

Yet another object of the present invention is to provide a die-separating process which utilizes at least one set of partial separation channels cut in the wafer material along scribe lines separating each die from adjacent dies in a wafer, followed by application of roller pressure to the backside of the dies to complete separation of each die from the adjacent dies and prevent or at least minimize cracking or chipping of the dies due to saw-induced vibrational energy during the die separation process.

SUMMARY OF THE INVENTION

In accordance with these and other objects and advantages, the present invention is generally directed to a new and improved process for separating IC dies from a wafer substrate in such a manner as to prevent or at least minimize or reduce cracking and/or chipping of the dies due to vibrational energy imparted to the dies by a dicing saw blade. In one embodiment, complete separation channels are initially cut through the wafer between dies along one axis. Next, partial separation channels are cut into the wafer along an intersecting axis, leaving wafer material connecting adjacent dies. In another embodiment, partial separation channels are cut into the wafer along one axis, after which complete separation channels are cut through the wafer along the intersecting axis. In still another embodiment, partial separation channels are cut along both axes. In each of the embodiments, the wafer material connecting adjacent dies beneath the partial separation channels absorbs vibrational energy imparted by the wafer saw to prevent chipping and/or cracking of the dies. A roller is typically applied to the backside of the partially-separated dies to complete separation of the dies from each other without the formation of cracks and/or chips in the dies.

BRIEF DESCRIPTION OF THE DRAWINGS

The invention will now be described, by way of example, with reference to the accompanying drawings, in which:

FIG. 4B is a cross-sectional view, taken along section lines 4B—4B in FIG. 4A, illustrating full cuts through the wafer material along X-axis scribe lines on the wafer in a first step of the process;

FIG. 4C is a cross-sectional view, taken along section lines 4C—4C in FIG. 4A, illustrating partial cuts through the wafer material along Y-axis scribe lines on the wafer in a second step of the process;

FIG. 5A is a top view, partially in section, of a wafer with multiple dies fabricated thereon, more particularly illustrating separation of the dies according to a second embodiment of the process of the present invention;

FIG. 5B is a cross-sectional view, taken along section lines 5B—5B in FIG. 5A, illustrating partial cuts through the wafer material along X-axis scribe lines on the wafer in a first step of the process;

FIG. 5C is a cross-sectional view, taken along section lines 5C—5C in FIG. 5A, illustrating full cuts through the wafer material along Y-axis scribe lines on the wafer in a second step of the process;

FIG. 6A is a top view, partially in section, of a wafer with multiple dies fabricated thereon, more particularly illustrating separation of the dies according to a third embodiment of the process of the present invention;

FIG. 6B is a cross-sectional view, taken along section lines 6B—6B in FIG. 6A, illustrating partial cuts through the wafer material along X-axis scribe lines on the wafer;

FIG. 6C is a cross-sectional view, taken along section lines 6C—6C in FIG. 6A, illustrating partial cuts through the wafer material along Y-axis scribe lines on the wafer; and FIG. 7 is a cross-sectional view of an IC wafer, with multiple IC dies fabricated thereon, more particularly illustrating a pressure roller technique for completing the die-separation process according to the present invention.

DESCRIPTION OF THE PREFERRED EMBODIMENTS

When used herein, the term, "partial separation channel" shall be construed to mean a channel cut partially through the thickness of a wafer, whether normal cut or bevel cut. When used herein, the term, "complete separation channel" shall be construed to mean a channel cut substantially completely through the thickness of a wafer, whether normal cut or bevel cut.

Figure 1:
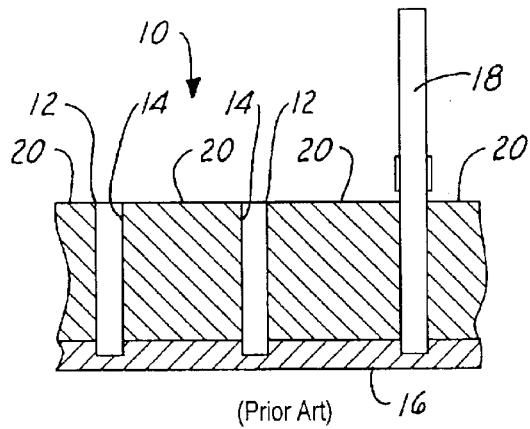
FIG. 1 is a cross-sectional view of a wafer with multiple IC (integrated circuit) dies fabricated thereon, more particularly illustrating a conventional process for separating the dies from each other and from the wafer.
Figure 2:
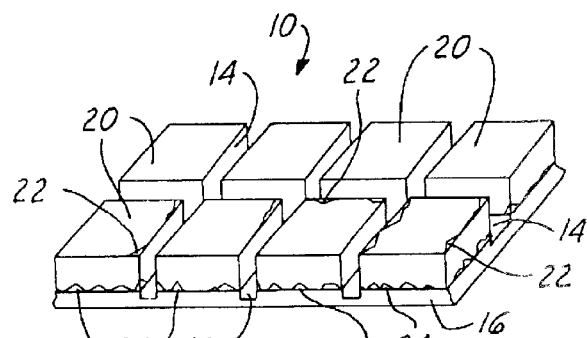
FIG. 2 is a perspective view, partially in section, of a wafer with IC dies fabricated thereon, illustrating inadvertent chipping and cracking of the dies which is commonly associated with conventional die-separating processes.
Figure 3:
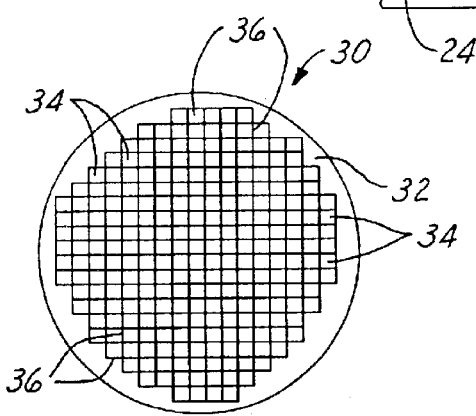
FIG. 3 is a top view of an IC wafer which is suitable for implementation of the process of the present invention.
Figure 4A:
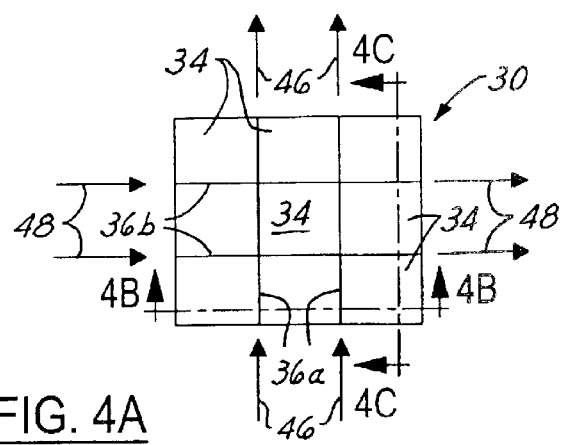
FIG. 4A is a top view, partially in section, of a wafer with multiple dies fabricated thereon, more particularly illustrating separation of the dies according to a first embodiment of the process of the present invention.

Referring initially to FIGS. 3–4C, the die-separating process of the present invention is capable of separating multiple IC dies 34 fabricated on the typically silicon substrate 32 of an IC semiconductor wafer 30. Multiple, adjacent and intersecting scribe lines 36 previously inscribed in the silicon substrate 32 separate the rectangular-shaped IC dies 34 from each other on the surface of the wafer 30. As shown in FIG. 4A, the scribe lines 36 include multiple, parallel X-axis scribe lines 36a which extend in the X-axis direction on the wafer 30 and multiple, parallel Y-axis scribe lines 36b which extend in the Y-axis direction on the wafer 30 in intersecting relationship to the X-axis scribe lines 36a. Prior to separating the IC dies 34 from each other and from the wafer 30, as hereinafter described, the backside 31 of the wafer 30 is secured to an adhesive tape 44, as is well known in the art. The adhesive tape 44 is supported on a suitable support surface (not shown), as is also known by those skilled in the art.

In a first embodiment of the process of the present invention, the IC dies 34 are separated from each other in the wafer 30 as follows. In a first step of the process, a saw blade 42 of a wafer-cutting saw (not shown), which may be conventional, is used to cut complete separation channels 38 through the entire thickness or vertical dimension of the wafer 30, as shown in FIG. 4B, in the X-axis direction 46 and along the X-axis scribe lines 36a on the wafer 30, as shown in FIG. 4A. Accordingly, as further shown in FIG. 4B, the complete separation channels 38 completely separate adjacent dies 34 on the wafer 30 and may extend into the underlying adhesive tape 44. Typically, but not necessarily, the complete separation channels 38 extend about halfway through the thickness of the underlying adhesive tape 44, leaving at least the bottom half thickness of the adhesive tape 44 intact.

In a second step of the process, the saw blade 42 is used to cut partial separation channels 39 through most of the thickness or vertical dimension of the wafer 30, as shown in FIG. 4C. The partial separation channels 39 are formed in the Y-axis direction 48 and along the Y-axis scribe lines 36b on the wafer 30, as shown in FIG. 4A. Because the partial separation channels 39 do not extend through the entire thickness of the wafer 30, silicon wafer material 40 remains between adjacent dies 34, between the bottom of each partial separation channel 39 and the upper surface of the adhesive tape 44. The silicon wafer material 40 typically has a thickness 41 of from about 0.5 mm to about 2.0 mm. After formation, the partial separation channels 39 intersect the complete separation channels 38 previously formed in the first step of the die-separating process. As the partial separation channels 39 are cut in the wafer 30, the silicon wafer material 40 remaining between the bottom of each separation channel 39 and the backside 31 of the wafer 30 absorb most of the vibrational energy imparted to the wafer 30 by the saw blade 42. Consequently, the vibrational saw energy is attenuated and thus, tends not to crack or chip the IC dies 34 in the wafer 30.

Referring next to FIG. 7, in a final step according to the process of the present invention, separation of the IC die 34 from each other is completed typically by applying a pressure roller 90 along the adhesive tape 44 at the backside 31 of the wafer 30. Accordingly, the silicon wafer material 40 which joins adjacent die 34 along the Y-axis partial separation channels 39 is broken, completely separating the adjacent IC dies 39. The separated IC dies 39 initially remain attached to the adhesive tape 44, after which the IC dies 39 are lifted from the adhesive tape 44 by procedures which are known by those skilled in the art.

Referring next to FIGS. 5A–5C, in a second embodiment of the process of the present invention, multiple IC dies 54 are separated from each other in a wafer 50 by reversing the first and second steps heretofore described with respect to the first embodiment of the invention, as follows. In a first step of the process of the second embodiment, a saw blade 62 of a wafer-cutting saw (not shown) is used to cut partial separation channels 59 in the wafer 50, as shown in FIG. 5B, in the X-axis direction 66 and along the X-axis scribe lines 56a on the wafer 50, as shown in FIG. 5A. Because the partial separation channels 59 do not extend through the entire thickness of the wafer 50, silicon wafer material 60 remains between adjacent dies 54, between the bottom of each partial separation channel 59 and the upper surface of the adhesive tape 64 at the backside 51 of the wafer 50. The silicon wafer material 60 typically has a thickness 61 of from about 0.5 mm to about 2.0 mm.

In a second step of the process of the second embodiment, the saw blade 62 is used to cut complete separation channels 58 through the entire thickness or vertical dimension of the wafer 50, as shown in FIG. 5C, in the Y-axis direction 68 and along the Y-axis scribe lines 56b on the wafer 50, as shown in FIG. 5A. Accordingly, the complete separation channels 58 intersect the partial separation channels 59 previously cut along the X-axis scribe lines 56a and completely separate adjacent die 54 on the wafer 50, as further shown in FIG. 5C. The complete separation channels 58 typically extend into the underlying adhesive tape 64. The complete separation channels 58 may extend about halfway through the thickness of the underlying adhesive tape 64, leaving at least the bottom half thickness of the adhesive tape 64 intact. As the complete separation channels 58 are cut in the wafer 50, the silicon wafer material 60 (FIG. 5B), which remains between adjacent IC dies 54 after the first step of the process described herein above, absorb most of the vibrational energy imparted by the saw blade 62 to the wafer 50. Consequently, the formation of chips and cracks (not shown) in the IC dies 54 is eliminated or at least, substantially reduced. After the complete separation channels 58 are cut in the wafer 50, the IC dies 54 are separated from each other in the wafer 50 typically by applying a pressure roller 90 to the adhesive tape 64, in the same manner as heretofore described with respect to FIG. 7.

Referring next to FIGS. 6A–6C, in a third embodiment of the process of the present invention, multiple IC dies 74 are separated from each other in a wafer 70 as follows. In a first step of the process, a saw blade 82 of a wafer-cutting saw (not shown) is used to cut partial separation channels 78 in the wafer 70, as shown in FIG. 6B, in the X-axis direction 86 and along the X-axis scribe lines 76a on the wafer 70, as shown in FIG. 6A. Accordingly, silicon wafer material 80 remains between adjacent dies 74, between the bottom of each partial separation channel 78 and the upper surface of the adhesive tape 84 at the backside 71 of the wafer 70. The silicon wafer material 80 typically has a thickness 81 of from about 0.5 mm to about 2.0 mm.

In a second step according to the third embodiment of the present invention, the saw blade 82 is used to cut additional partial separation channels 78 in the wafer 70, as shown in FIG. 6C, in the Y-axis direction 88 and along the Y-axis scribe lines 76b on the wafer 70, as shown in FIG. 6A. Accordingly, silicon wafer material 80, typically having a thickness 81 of from about 0.5 mm to about 2.0 mm, remains between adjacent dies 74, between the bottom of each partial separation channel 78 and the upper surface of the adhesive tape 84. The silicon wafer material 80 remaining between adjacent dies 74 absorbs most of the vibrational energy imparted by the saw blade 82 to the wafer 70, and consequently, the formation of chips and cracks (not shown) in the IC dies 74 is eliminated or substantially reduced. As a final step in the process, the IC dies 74 are separated from each other in the wafer 70 typically by applying a pressure roller 90 to the adhesive tape 84, in the same manner as heretofore described with respect to FIG. 7.

While the preferred embodiments of the invention have been described above, it will be recognized and understood that various modifications can be made in the invention and the appended claims are intended to cover all such modifications which may fall within the spirit and scope of the invention.

What is claimed is:

1. A process for separatin dies on a wafer, comprising the steps of:
   providing an adhesive tape on a backside of said wafer;
   cutting a set of partial separation channels in said wafer between adjacent ones of said dies along a first axis of said wafer, with wafer material remaining intact between said partial separation channels, respectively, and said adhesive tape;
   cutting a set of complete separation channels in said wafer between adjacent ones of said dies along a second axis of said wafer; and
   separating said dies from each other along said wafer material.

2. The process of claim 1 wherein said wafer material has a thickness of from about 0.5 mm to about 2.0 mm.

3. The process of claim 1 wherein said separating said dies from each other along said wafer material comprises applying a pressure roller to said adhesive tape at said backside of said wafer.

4. The process of claim 3 wherein said wafer material has a thickness of from about 0.5 mm to about 2.0 mm.

5. A process for separatin dies on a wafer, comprising the steps of:
   providing an adhesive tape on a backside of said wafer;
   cutting a set of complete separation channels substantially completely through said wafer between adjacent ones of said dies and along a first axis of said wafer;
   cutting a set of partial separation channels in said wafer between adjacent ones of said dies and along a second axis of said wafer, with wafer material remaining intact between said partial separation channels, respectively, and said adhesive tape; and
   separating said dies from each other along said wafer material by applying pressure to said wafer along one of said first axis and said second axis.

6. The process of claim 5 wherein said wafer material has a thickness of from about 0.5 mm to about 2.0 mm.

7. The process of claim 5 wherein said separating said dies from each other along said wafer material comprises applying a pressure roller to said adhesive tape at said backside of said wafer.

8. The process of claim 7 wherein said wafer material has a thickness of from about 0.5 mm to about 2.0 mm.

* * * * *

UNITED STATES PATENT AND TRADEMARK OFFICE
CERTIFICATE OF CORRECTION

PATENT NO.  : 6,849,523 B2
DATED       : February 1, 2005
INVENTOR(S) : Chao et al.

It is certified that error appears in the above-identified patent and that said Letters Patent is hereby corrected as shown below:

<u>Column 7,</u>
Line 8, delete "separatin" and insert -- separating --.

<u>Column 8,</u>
Line 3, delete "separatin" and insert -- separating --.

Signed and Sealed this

Twenty-first Day of March, 2006

JON W. DUDAS
*Director of the United States Patent and Trademark Office*